United States Patent [19]

Maurer et al.

[11] Patent Number: 4,473,801
[45] Date of Patent: Sep. 25, 1984

[54] DEMODULATOR CIRCUIT WITH PHASE CONTROL LOOP

[76] Inventors: Robert Maurer, Am Staden 11; Michael Hoffmann, Semperstrasse 18, both of D-6600 Saarbrücken, Fed. Rep. of Germany

[21] Appl. No.: 104,021

[22] Filed: Dec. 17, 1979

[51] Int. Cl.³ .......................... H03D 1/04; H03D 3/24
[52] U.S. Cl. ....................................... 329/50; 329/122; 329/132; 329/136
[58] Field of Search .......... 329/50, 122, 124, 131–134, 329/153, 154, 168, 169, 178, 179, 136; 455/208, 210, 214, 337

[56] References Cited

U.S. PATENT DOCUMENTS

| 3,209,271 | 9/1965 | Smith | 329/122 |
| 3,976,943 | 8/1976 | Cipher et al. | 329/132 X |
| 4,059,805 | 11/1977 | de Laage de Meux et al. | 329/50 |

*Primary Examiner*—Siegfried H. Grimm

[57] ABSTRACT

A demodulator circuit for demodulating an input signal constituted by a modulated carrier. The circuit is provided with a phase control loop composed of a signal mixer having two inputs and an output and providing a signal at its output proportional to the algebraic product of the signals at its inputs, one of the mixer inputs being arranged to receive the demodulator circuit input signal, a voltage controlled oscillator having a control input and an output connected to the other input of the mixer and providing a signal at a frequency varying linearly with the voltage at its control input, and a lowpass filter connected between the mixer output and the oscillator control input. The components of the loop present a set of parameters defining the operation of the loop, which parameters include the peak voltage at the output of the oscillator, the oscillator modulation sensitivity, the voltage amplification factor of the lowpass filter and the gain of the mixer. Circuit devices are connected to the loop for varying at least one of the parameters in inverse proportion to the peak amplitude of the input signal carrier for causing the product of the parameters and the carrier peak amplitude to be substantially constant.

6 Claims, 17 Drawing Figures

FIG.1

PRIOR ART

FIG.2

PRIOR ART

FIG.15 Passive filter

FIG.16 Active filter

DEMODULATOR CIRCUIT WITH PHASE CONTROL LOOP

BACKGROUND OF THE INVENTION

The present invention relates to a demodulator circuit with phase control loop, of the type including a mixer which multiplies, or combines, an input signal with the output signal from a voltage controlled oscillator the control voltage for which is the output voltage from the mixer conducted through a lowpass filter.

A phase locked loop (PLL), or phase control loop is known to be a control system in which the instantaneous phase of a voltage controlled oscillator (VCO) is caused to follow the instantaneous phase of an input signal (broadband PLL) or the phase of the spectral line of the carrier of the input signal (narrow band PLL).

Figure 1:
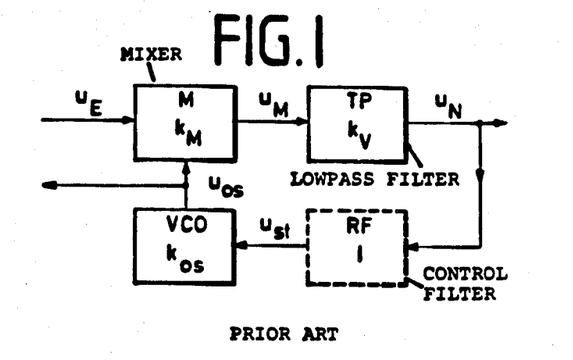
FIG. 1 is a block circuit diagram of a phase control loop which has already been described.

FIG. 1 is a block circuit diagram of a PLL which operates without input signal limitation, that means the amplitude of the input signal is not limited, if the input signal power does not exceed a specified value.

The illustrated circuit includes a mixer M, a voltage controlled oscillator VCO and a lowpass filter TP. A control filter RF with lowpass characteristics is used only for narrow band PLL and is shown in broken lines.

The input signal $u_E$ can be defined as follows:

$$u_E(t) = \hat{u}_T \sin(\omega_T t + \phi(t) + \phi_T) \tag{1}$$

where $\hat{u}_T$ is the input signal carrier peak voltage,
$\omega_T$ is the carrier angular frequency,
$\phi(t)$ is a time-varying phase which can contain the information to be transmitted.
$\phi_T$ is carrier signal phase.

If $u_{st}$ is the control voltage of the VCO and $k_{os}$ its modulation sensitivity, the VCO output signal $u_{os}(t)$ can de defined as follows:

$$u_{os}(t) = \hat{u}_{os} \cos\left(\omega_{os} t + k_{os} \int_0^t u_{st}(\tau)d\tau + \phi_{os}\right). \tag{2}$$

where
$\hat{u}_{os}$ is the VCO output signal peak voltage,
$\omega_{os}$ is the VCO output signal residual angular frequency,
$\phi_{os}$ is the VCO output signal phase,
$\tau$ is an integration variable. Its dimension is time.
$u_E$ and $u_{os}$ are multiplied in mixer M and the result is:

$$u_M(t) = k_M u_E(t) u_{os}(t) \tag{3}$$

$$= \tfrac{1}{2} k_M \hat{u}_T \hat{u}_{os} \left\{ \sin\left( (\omega_T - \omega_{os})t + \phi(t) - k_{os} \int_0^t u_{st}(\tau)d\tau - \phi_{os} + \phi_T \right) + \sin\left( (\omega_T + \omega_{os})t + \phi(t) + k_{os} \int_0^t u_{st}(\tau)d\tau + \phi_{os} + \phi_T \right) \right\}$$

where $k_m$ is the voltage gain of mixer M.

With suitable dimensioning of the lowpass filter TP the voltage at the sum frequency is suppressed and the result is:

$$u_N(t) = \tfrac{1}{2} k_M k_V \hat{u}_T \hat{u}_{os} \sin\left( (\omega_T - \omega_{os})t + \phi(t) - k_{os} \int_0^t u_{st}(\tau)d\tau - \phi_{os} + \phi_T \right). \tag{4}$$

where $k_v$ is the voltage gain of filter TP.

In a narrowband PLL whose oscillator phase is to be brought only to the spectral line of the carrier of the input signal, the control filter RF filters out all spectral components of $u_N$ except for those at the lowest frequencies and, under the condition that the carrier frequency and the oscillator frequency lie sufficiently closely together, the result is the following:

$$u_{st}(t) = \tag{5}$$

$$\tfrac{1}{2} k_M k_V \hat{u}_T \hat{u}_{os} \sin\left( (\omega_T - \omega_{os})t - k_{os} \int_0^t u_{st}(\tau) - \phi_{os} + \phi_T \right).$$

This equation can be solved exactly in a manner described in: A. Blanchard, Phase Locked Loops, John Wiley & Sons, New York, 1976, in Chapter 10.1. It is then found that a steady state solution is possible if the following applies;

$$|\omega_T - \omega_{os}| < |\tfrac{1}{2} k_M k_V k_{os} \hat{u}_s \hat{u}_{os}|. \tag{6}$$

The following definition therefore applies:

$$\omega_P = |\tfrac{1}{2} k_M k_V k_{os} \hat{u}_{os}| \hat{u}_T. \tag{7}$$

It then follows from (6) that:

$$|\omega_T - \omega_{os}| < \omega_P. \tag{8}$$

$\omega_P$ is a characteristic angular frequency of the loop. The value of the parameter $\omega_p$ is thus of great significance for the proper operation of the PLL.

When solving equation (5), it is noted that the following asymptotic values appear:

$$\omega_{os} \to \omega_T \tag{9}$$

$$\omega_{os} \to \phi_T + \arcsin \frac{\omega_T - \omega_{os}}{\omega_P}. \tag{10}$$

From the last two equations it becomes evident that the PLL, under condition (8), pulls the oscillator frequency to the carrier frequency of the input signal and establishes a fixed phase relationship between carrier phase and oscillator phase. In other words, the PLL has "settled" on, or tracks, the carrier phase. If the carrier frequency and the oscillator frequency lie sufficiently closely together, the phase shift between $u_E$ and $u_{os}$ is then almost 90°. The absolute values of the arguments, of the angle functions in equations (4) and (5) must then be much smaller than 1. This enables these equations to be linearized since, for sine functions, the functions can be replaced by their arguments; i.e. if $|X|<<1$, sin $X \approx X$. The result is:

$$u_N(t) = \qquad (11)$$

$$\frac{\omega_P}{k_{os}}\left\{(\omega_T - \omega_{os})t - k_{os}\int_0^t u_{st}(\tau)d\tau - \phi_{os} + \phi_T + \phi(t)\right\}$$

$$u_{st}(t) = \frac{\omega_P}{k_{os}}\left\{(\omega_T - \omega_{os})t - k_{os}\int_0^t u_{st}(\tau)d\tau - \phi_{os} + \phi_T\right\}. \qquad (12)$$

After differentiation with respect to time (t), equation (12) yields the following differential equation $$\dot{u}_{st}(t) + \omega_P u_{st}(t) = \frac{\omega_P}{k_{os}}(\omega_T - \omega_{os}). \qquad (13)$$

This is the equation for a lowpass filter with the limit, or half-power cutoff frequency $\omega_p/2\pi$. Together with the parameters of the lowpass filter TP and the control filter RF, the parameter $\omega_P$ will thus also influence the stability of the control loop.

A broadband PLL contains no control filter RF. Its work is performed by the lowpass filter TP. For the settled state of operation, differentiation of equation (4) or (11), given that $u_{st}(t)$ is now identical to $u_N(t)$, respectively, will then produce:

$$\dot{u}_{st}(t) + \omega_P u_{st}(t) = \frac{\omega_P}{k_{os}}\{(\omega_T - \omega_{os}) + \dot{\phi}(t)\}. \qquad (14)$$

Here again this is unequivocal lowpass behavior at the limit frequency $\omega_P/2\pi$, which also influences the stability of the loop. In contradistinction to the narrowband PLL, and if $|\phi(t)|$ is sufficiently small, the following asymptotic values will appear:

$$\omega_{os} \rightarrow \omega_T + \dot{\phi}(t) \qquad (15)$$

$$\phi_{os} \rightarrow \phi_T + \arcsin\frac{\omega_T + \dot{\phi}(t) - \omega_{os}}{\omega_P} \qquad (16)$$

Thus, in contradistinction to the narrowband PLL, in the broadband PLL the momentary phase of the VCO signal adjusts itself to the momentary phase of the input signal and not to its carrier phase. For settling of the broadband PLL, the following restriction must be met instead of (8):

$$|\omega_T - \omega_{os} \pm \dot{\phi}(t)| < \omega_P. \qquad (17)$$

In addition to the demonstrated significance of $\omega_P$ for the settling behavior and the stability of the loop, in the broadband PLL as well as in the narrowband PLL, the value of this parameter usually also has a decisive influence on the further processing of the signals obtained in the PLL. Three examples will be discussed for the purpose of explanation:

It is known that a narrowband PLL can be used as a phase modulation (PM) demodulator if the input signal is modulated with small phase deviations. Due to equations (9) and (10), an oscillator signal will appear in the settled case when the VCO is tuned to the carrier frequency. This oscillator signal is the following:

$$u_{os}(t) = \hat{u}_{os}\cos(\omega_T t + \phi_T) \qquad 18)$$

Then it follows, for the voltage $u_N(t)$ at the output of the lowpass filter TP, that:

$$u_N(t) = \frac{\omega_P}{k_{os}}\sin\phi(t). \qquad 19)$$

For values of $|\phi(t)|<<1$ it can be stated in approximation that:

$$u_N(t) \simeq \frac{\omega_P}{k_{os}}\phi(t). \qquad 20)$$

This shows, on the one hand, that the demodulated signal is present at the output of the lowpass filter and, on the other hand, that the amplitude of the output signal depends directly on $\omega_P$.

Figure 2:
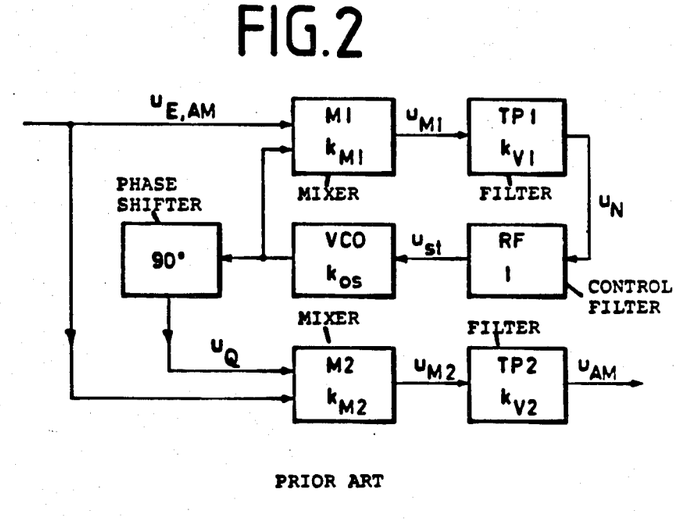
FIG. 2 is a block circuit diagram of an AM demodulator with PLL carrier recovery, which has already been described.

It is known that the narrowband PLL can also be used for the synchronous demodulation of an AM signal. FIG. 2 shows the block circuit diagram of such a demodulator.

The amplitude modulated input signal can be shown as follows:

$$u_{E,AM}(t) = \hat{u}_T(1 + m(t))\sin(\omega_T t + \phi_T) \qquad 21)$$

with $$||m(t)|| \leq 1. \qquad 22)$$

where m(t) is the degree of modulation of the signal carrier, and where $||m(t)||$ means the norm of m(t) being defined as the maximum of the absolute value of m(t).

If the frequencies contained in the sprectrum of m(t) do not fall below a minimum value of $f_{min}>0$, a control signal can again be derived, if the control filter RF is of suitable design, as shown in equation (12) which pulls the VCO to the carrier frequency of the input signal and asymptotically sets the VCO phase to the value provided by equation (10). Then the VCO output signal is derived as shown in equation (18) for the settled case and for tuning of the VCO residual frequency to the carrier frequency. After a shift in phase of about 90°, this produces the following voltage $u_Q(t)$:

$$u_Q(t) = \hat{u}_{os}\sin(\omega_T t + \phi_T). \qquad 23)$$

$u_Q(t)$ is combined with $u_{E,AM}$ in a mixer M2 where the resulting mixer voltage is produced:

$$u_{M2}(t) = k_{M2}\hat{u}_{os}\hat{u}_T(1 + m(t))\sin^2(\omega_T t + \phi_T) \qquad 24)$$

$$= \tfrac{1}{2}k_{M2}\hat{u}_{os}\hat{u}_T(1 + m(t))(1 - \cos(2\omega_T t + 2\phi_T))$$

If the lowpass filter TP2 is dimensioned so that signals with frequencies near $2f_T$ are attenuated to a sufficient extent but signals with frequencies in the low frequency band are practically not attenuated at all, the following voltage appears at the output of TP2:

$$u_{AM}(t) = \tfrac{1}{2}k_{M2}k_{V2}u_{os}\hat{u}_T(1 + m(t)). \qquad 25)$$

The gains of mixers M1 and M2 and of the lowpass filter blocks TP1 and TP2 are permanently set. Thus a fixed ratio can be defined as follows:

$$k_{AM} = \frac{k_{M2}k_{V2}}{|k_{M1}k_{V1}k_{os}|} \quad (26)$$

And it follows that:

$$u_{AM}(t) = k_{AM}\omega_P(1 + m(t)) \quad (27)$$

At the output of the lowpass filter TP2 there thus is available the demodulated signal with a superposed direct voltage. It is again evident that the amplitude of the output signal depends on the carrier amplitude of the input signal which is a factor of $\omega_P$.

It is known that FM demodulation can be effected with a broadband PLL. One suitable circuit is that shown in FIG. 1, without the control filter RF. The demodulator output is selected to be the output of the lowpass filter TP, with an output voltage $u_N(t)$.

The input signal is assumed to be as defined in equation (1):

$$u_E(t) = \hat{u}_T \sin(\omega_T t + \phi(t) + \phi_T). \quad (28)$$

Then the information to be transmitted is contained in the time derivative of $\phi(t)$.

In the settled condition, and with tuning of the VCO to the carrier frequency of the input signal, equation (14) provides the following:

$$\frac{1}{\omega_P} \dot{u}_{st}(t) + u_{st}(t) = \frac{1}{k_{os}} \dot{\phi}(t). \quad (29)$$

The voltage $u_{st}(t)$ can thus be considered the output voltage of a lowpass filter which is fed in with the input voltage $\phi(t)/k_{os}$ and whose limit frequency is $\omega_P/2\pi$. With a sufficiently large value for $\omega_P$, $u_{st}(t)$ is therefore $= u_N(t)$, and the demodulated information does not depend on the carrier amplitude of the input signal. Nevertheless the influence of the carrier amplitude is significant, being a factor in the limit frequency $\omega_P$: if $\omega_P/2\pi$ becomes less than $f_{NF,max}$ it must be expected that the information will be greatly distorted.

$f_{NF,max}$ is the maximum information frequency to be transmitted.

The above examples show the significant influence of $\omega_P$ on a satisfactory result of the circuit function.

The prior art technical solutions counter the dependency of the PLL on the carrier amplitude of the input signal by connecting a limiter bandpass filter ahead of the circuit when angle modulated signals are being processed. The use of a limiter requires the connection of a highly selective filter ahead of the limiter since otherwise the limiter will not perform its amplitude stabilizing function. Due to the extreme nonlinearity of the limiter, there is cause for intermodulation problems. Finally, the limiter worsens the signal to noise ratio within the PLL, as described in: J. C. Springett, and M. K. Simon, "An Analysis of the Phase Coherent-Incoherent Output of the Bandpass Limiter", IEEE Trans. Comm. Techn. Vol. COM-19, No. 1, Feb. 1971, pages 42-49. With amplitude modulated signals, it is known in the prior art to connect an amplifier for automatic gain control ahead of the PLL.

Amplitude regulation ahead of the PLL has already been examined, as described in A. Blanchard, "Phase Locked Loops", John Wiley & Sons, New York, 1976, Chapter 11.2.1; and R. Jaffee, and R. Rechtin, "Design and Performance of Phase Locked Circuits Capable of Near Optimum Performance Over a Wide Range of Input Signal and Noise Levels", IRE Trans. on Inform. Theory, Vol. IT-1, pages 66-76, Mar., 1955.

SUMMARY OF THE INVENTION

It is an object of the present invention to improve the behavior of demodulator circuits with phase control loop with respect to the control properties of the phase control loop, its stability and its signal to noise ratio.

This and other objects are accomplished by the present invention by causing at least one of the parameters of the phase control loop, i.e. the amplitude of the output signal of the voltage controlled oscillator, the modulation sensitivity of the voltage controlled oscillator, the voltage amplification in the lowpass filter or the gain of the mixer to vary in inverse proportion to the carrier amplitude of the input signal so that the product of the parameters and the carrier amplitude is constant. Advantageous circuits for determining the carrier amplitude of the input signal and for regulating the amplitude of the output signal of the voltage controlled oscillator, the voltage amplification in the lowpass filter, the modulation sensitivity of the voltage controlled oscillator and the gain of the mixer, in order to achieve the purposes of the invention, will be described.

A significant advantage of the invention is that without the drawbacks of amplitude regulation ahead of the PLL an interesting class of demodulators, the so-called "adaptive" demodulators, can be constructed.

According to equation (29), a broadband PLL FM demodulator acts as a lowpass filter with the limit frequency $\omega_P/2\pi$. A conventional FM demodulator worsens the signal to noise ratio at the output to such an extent when the signal to noise ratio at the input falls below the demodulator threshold that demodulation is no longer possible. An "adaptive" PLL demodulator utilizes its lowpass characteristics to reduce the threshold level under certain conditions.

An improvement in the threshold value occurs if the parameter $\omega_P$ is controlled or regulated as follows in dependence on $\hat{u}_T$: if the input amplitude drops below a predetermined value $u_{Tmin}$, $\omega_P$ should drop as a direct function of $\hat{u}_T$. For $\hat{u}_T \geq \hat{u}_{Tmin}$, $\omega_P$ should equal $\omega_{P0}$, where $\omega_{P0}$ is a minimum value for meeting the system operating requirements. If thus $\hat{u}_T$ drops below $\hat{u}_{Tmin}$, the low frequency bandwidth automatically becomes smaller. Thus the low frequency noise power is also reduced. By giving up low frequency information bandwidth, the signal to noise ratio at the output is improved. An adaptive demodulator consequently operates, although with restricted information bandwidth, when conventional demodulators fail. It is this adaptibe behavior which gives this class of modulators its name.

By regulating or controlling $\omega_P$, the dynamic range remains large. In principle an adaptive demodulator can also operate without regulation or control of $\omega_P$ or $\hat{u}_T$. But then there occur considerable stability problems.

Similar adaptive demodulators can be constructed for broadband or narrowband PM.

Because amplitude limitation ahead of FM or PM systems has previously always been considered a necessity, the adaptive behavior was not recognized. Only with the PLL regulation according to the present invention can this concept be utilized in an optimum manner.

DESCRIPTION OF THE PREFERRED EMBODIMENTS

According to a basic principle of the invention, the term $$\omega_P = |\tfrac{1}{2} k_M k_{os} k_V \hat{u}_{os}| \hat{u}_T,$$

which is composed of the parameters of the phase control loop and the carrier amplitude of the input signal is kept essentially constant by causing at least one of the parameters $k_M$, $k_{os}$, $k_V$ or $\hat{u}_{os}$ to vary in inverse proportion to $\hat{u}_T$. In order to be able to regulate or control these parameters in the proper way, information about the value $\hat{u}_T$ must first be obtained. This can be done in principle by coherent or incoherent amplitude demodulation, which must be so selective, however, that a signal from an adjacent channel at the input side will not falsify the information.

Figure 3:
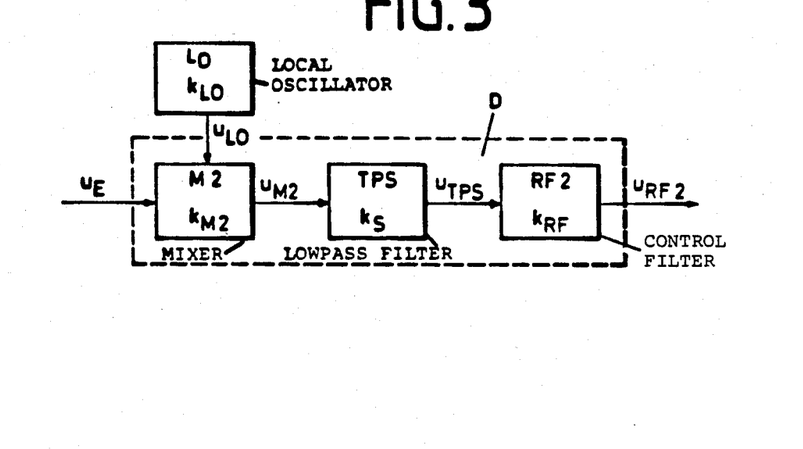
FIG. 3 is a block circuit diagram of a circuit for demolulating the carrier amplitude of the input signal according to the invention.

FIG. 3 shows the basic circuit diagram for such AM demodulation, composed of a cascade circuit D formed by a mixer M2, a lowpass filter TPS and a control filter RF2. The input signal $u_E(t)$ is multiplied in mixer M2 with a local oscillator signal $u_{Lo}(t)$, to produce the mixer output signal:

$$u_{M2}(t) = k_{M2} u_{Lo}(t) u_E(t) \qquad (30)$$

The lowpass filter TPS must have a high selectivity. Its bandwidth must be less than or equal to the bandwidth of the HF channel.

Thus signals from adjacent channels are prevented from contributing to the lowpass filter output signal $U_{TPS}(t)$. With $$u_E(t) = \hat{u}_T(1 + m(t)) \sin(\omega_T t + \phi(t) + \phi_T) \qquad (31)$$

and $$u_{Lo}(t) = \hat{u}_{Lo} \sin(\omega_T t + \phi_{Lo}) \qquad (32)$$

the following then results:

$$u_{TPS}(t) = \tfrac{1}{2} k_{M2} k_s \hat{u} \hat{u}_{Lo} (1 + m(t)) \cos(\phi(t) + \phi_T - \phi_{Lo}) \qquad 33)$$

This signal must be processed in a selective control filter RF2 in such a manner that only the time invariable component remains as the setting or control signal $u_{RF2}$. This can be done, for example, by forming the square root of the voltage mean square value (rms value). It then follows that:

$$u_{RF2} = \tfrac{1}{2} k_{M2} k_s k_{RF2} \hat{u} \hat{u}_{Lo} \qquad 34)$$

Thus a parameter is provided which is proportional to $u_T$.

With a local oscillator LO which always is in synchronism with the input signal, the derivation of the value proportional to $u_T$ would be easier. The following would then apply:

$$\cos(\phi(t) + \phi_T - \phi_{Lo}) \approx 1 \qquad 35)$$

therefore $$u_{TPS} = \tfrac{1}{2} k_{M2} k_s \hat{u} \hat{u}_{Lo} (1 + m(t)) \qquad 36)$$

By filtering with a control filter RF2 of sufficiently narrow bandwidth, the following result is obtained:

$$u_{RF2} = \tfrac{1}{2} k_{M2} k_s \hat{u} \hat{u}_{Lo} k_{RF2}. \qquad 37)$$

The further processing of the signal now depends on which one of the parameters $k_M$, $k_V$, $k_{os}$ or $\hat{u}_{os}$ is to be influenced.

Figure 4:
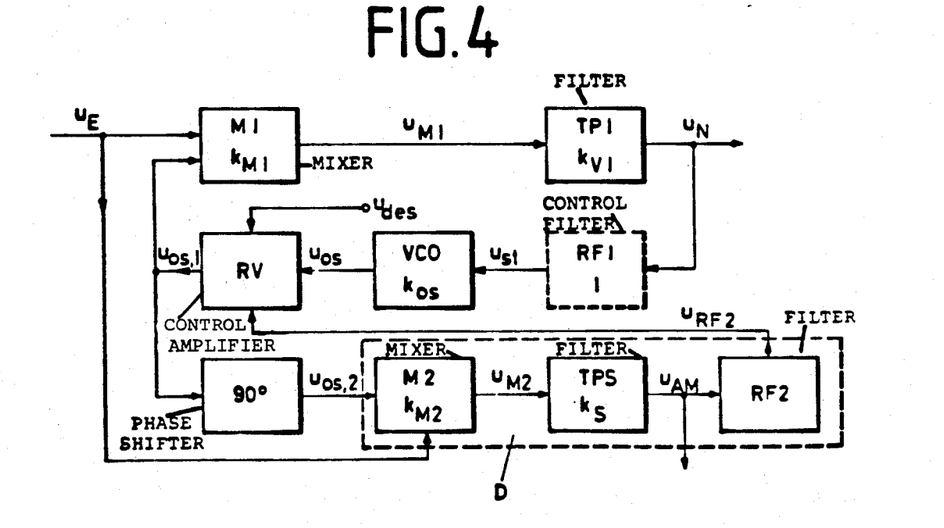
FIGS. 4, 5 and 6 are block circuit diagrams of preferred embodiments of circuits according to the invention employing AM demodulation, FIG. 4 showing a circuit for regulating the amplitude of the output signal of the voltage controlled oscillator, FIG. 5 showing a circuit for regulating the voltage amplification in the lowpass filter, and FIG. 6 showing a circuit for regulating the mixer gain.

By regulation of the VCO amplitude $\hat{u}_{os}$ a coherent AM demodulation can be effected. FIG. 4 shows the block circuit diagram for such a controlled PLL.

The blocks M1, TP1, RF1 and VCO form the actual PLL. For the PLL function a control amplifier RV can be considered to belong to the oscillator. The output signal $u_{os,1}$ from amplifier RV is supplied to a phase shifter which produces a signal $u_{os,2}$ shifted in phase by 90° with respect to the signal $u_{os,1}$. In the settled case the devices M2 and TPS therefore effect a coherent AM demodulation. As described in equations (34) and (37), the output voltage $u_{RF2}$ of device RF2 is then proportional to $\hat{u}_T$ and the peak amplitude of $u_{os,2}$ and therefore to the peak amplitude $\hat{u}_{os,1}$ of $u_{os,1}$. The gain G of the control amplifier RV is controlled by the difference voltage $u_{des} - u_{RF2}$. Since $u_{RF2}$ depends on $\hat{u}_{os,1}$ and $\hat{u}_{os,1}$ depends on the gain G, the voltage $u_{RF2}$ will vary (with suitable dimensioning of device RV), until $u_{RF2}$ equals $u_{des}$ being a constant voltage. Consequently, the algebraic product of $\hat{u}_{os,1}$ and $\hat{u}_T$ must be constant what is the desired aim.

The absolute value of gain G can be less than 1. Device RV works then as attenuator. The effect on the product of $\hat{u}_T$ and $\hat{u}_{os,1}$ will remain the same.

Figure 9:
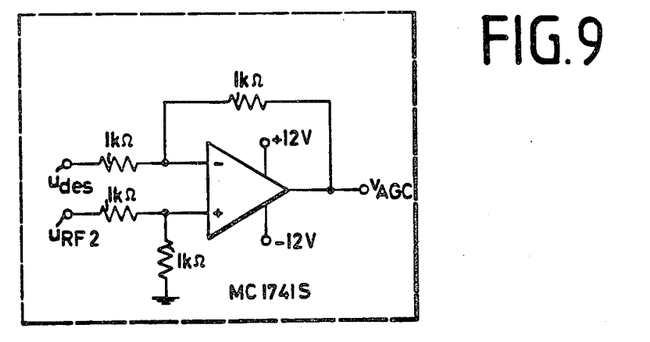
FIGS. 9 and 10 are circuit diagrams of an amplifier which can be used in circuits according to the invention.
Figure 10:
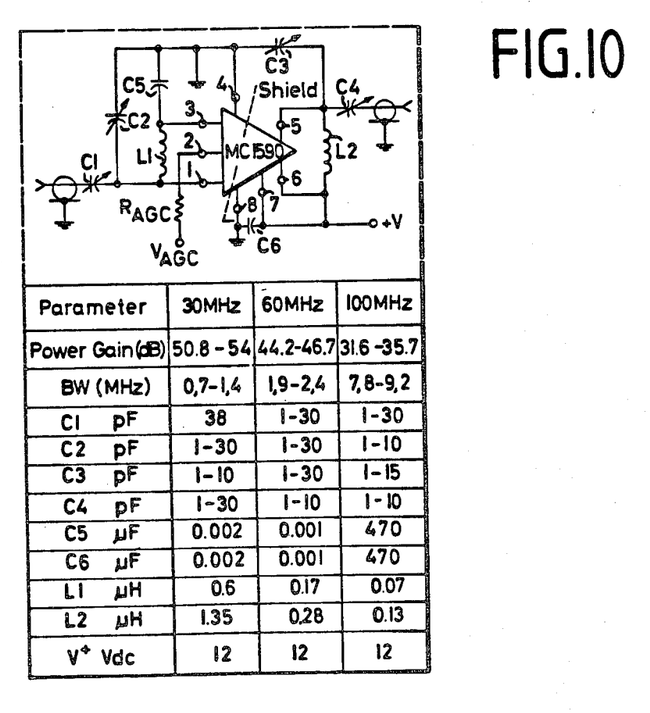

One possible operative embodiment of control amplifier RV is shown in FIGS. 9 and 10. Th difference of the voltages $u_{des}$ and $u_{RF2}$ is formed in a differential amplifier using an operational amplifier of the type Motorola MC1741S (FIG. 9). Its output signal $V_{AGC}$ is connected to the control input of the automatic gain control amplifier shown in FIG. 10. This amplifier is described in detail in Application Note AN-513 of Motorola Semiconductor Products Inc., Phoenix, Ariz. It uses the high gain integrated circuit amplifier Motorola MC1590 which is capable of automatic gain control. Signal input and output of this amplifier are signal input and output of the device RF2.

A second possibility is to control the gain in the low frequency path of the PLL. This can be done, for example, by varying the voltage amplification $k_{V1}$ in the lowpass filter TP1. The following then applies:

$$k_{V1} = \lim_{\omega \to 0} \frac{u_{TP1}(\omega)}{u_{M1}(\omega)} \quad (38)$$

where $u_{TP1}(\omega)$ is the lowpass filter output signal and $u_{M1}(\omega)$ is the lowpass filter input signal, which are functions of the information angular frequency $\omega$.

An increase in the modulation sensitivity $k_{os}$ would also take place in the low frequency path by influencing the modulation amplifier of the VCO.

The modulation sensitivity $k_{os}$ is defined as follows: If $\omega_{os}(t)$ is the instantaneous angular frequency of the VCO and $u_{st}(t)$ is its control voltage, the following applies (if $u_{st}$ is varying sufficiently slowly):

$$k_{os} = \frac{d\omega_{os}}{du_{st}} \quad (39)$$

Figure 5:
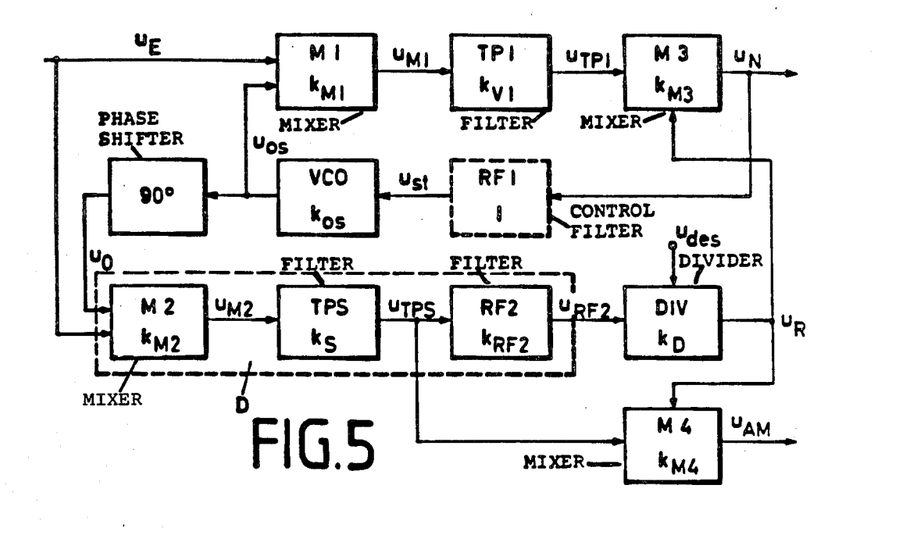

FIG. 5 shows a block diagram of a circuit providing regulation of the voltage amplification $k_V$ before $u_N(t)$ is coupled out.

The blocks M1, TP1, RF1 and VCO again form the actual PLL. The multiplier M3 can be considered as a low frequency amplifier with variable gain and can be considered to belong to the block TP1. AM demodulation is effected, as in the circuit of FIG. 4, by the block D. In contradistinction to the FIG. 4 circuit, however, the information signal $u_{RF2}$ must still be inverted, with the aid of a divider block DIV. With a voltage $u_{des}$ the weighted reciprocal of $u_{RF2}$, i.e. $u_{des}/u_{RF2}$, is then obtained at the output of the divider. The thus obtained signal $u_R$ has the following form:

$$u_R = k \frac{u_{des}}{u_T} \quad (40)$$

By multiplying the voltages $u_{TP1}$ and $u_R$ together in the mixer M3 the influence of $\hat{u}_T$ on $\omega_P$ is eliminated, in the signal $u_N$. The mixer M4 is not necessary if the AM information is not to be coupled out.

By weighting the signal $u_R$ with the voltage $u_{des}$, a desired value for $\omega_P$ can be set.

Figure 6:
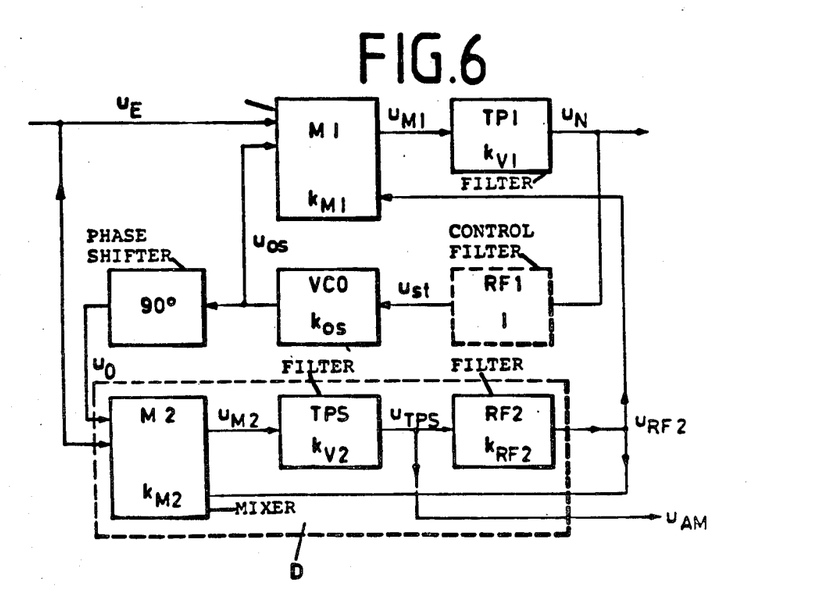
Figure 7:
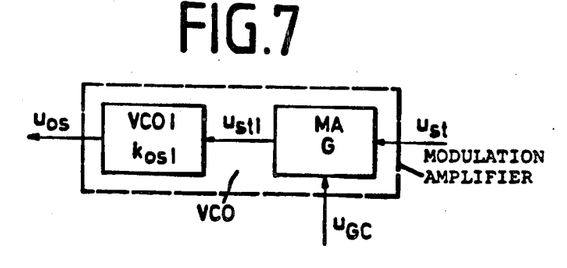
FIG. 7 is a block circuit diagram of a unit which can be used to construct circuits according to the invention.

There also exists the possibility of regulating the gain $k_{M1}$ of the mixer M1. A circuit for this purpose is shown in FIG. 6. In this circuit, the output signal $u_{RF2}$ of the AM demodulator D is fed to the control input of the mixer M1 to regulate its gain $k_{M1}$. In the circuit of FIG. 6, the signal $u_{RF2}$ is also used to regulate the gain $k_{M2}$ of the mixer M2 in the AM demodulator. The definition and significance of the mixer gain are given in equation (3). As said before, there exists the possibility of regulating the modulation sensitivity of the voltage controlled oscillator VCO. FIG. 7 shows the cascade circuit of a voltage controlled oscillator VCO1 and a modulation amplifier MA with voltage controlled gain. Its signal input voltage $u_{st}$ is amplified with gain G depending on the gain control voltage $u_{GC}$. G is a function of $u_{GC}$:

$$G = G(u_{GC}). \quad (41)$$

It therefore follows:

$$u_{st1} = G(u_{GC}) u_{st}, \quad (42)$$

where $u_{st1}$ is the control voltage of VCO1 and $u_{st}$ is the signal input voltage of MA. Due to equation (39) the modulation sensitivity of VCO1 is:

$$k_{os1} = \frac{d\omega_{os}}{du_{st1}} = \frac{1}{G(u_{GC})} \frac{d\omega_{os}}{du_{st}} \quad (43)$$

$\omega_{os}$ is the oscillator residual angular frequency. With the definition $$k_{os} = G(u_{GC}) K_{os1} \quad (44)$$

the following holds:

$$k_{os} = \frac{d\omega_{os}}{du_{st}}. \quad (45)$$

The cascade circuit of FIG. 7 can therefore be interpreted as a new voltage controlled oscillator VCO with voltage controlled modulation sensitivity $k_{os}$. The gain control input of the modulation amplifier MA is the modulation sensitivity control input of the oscillator VCO and the signal input of the modulation amplifier is the frequency control input of the oscillator VCO.

Figure 8:
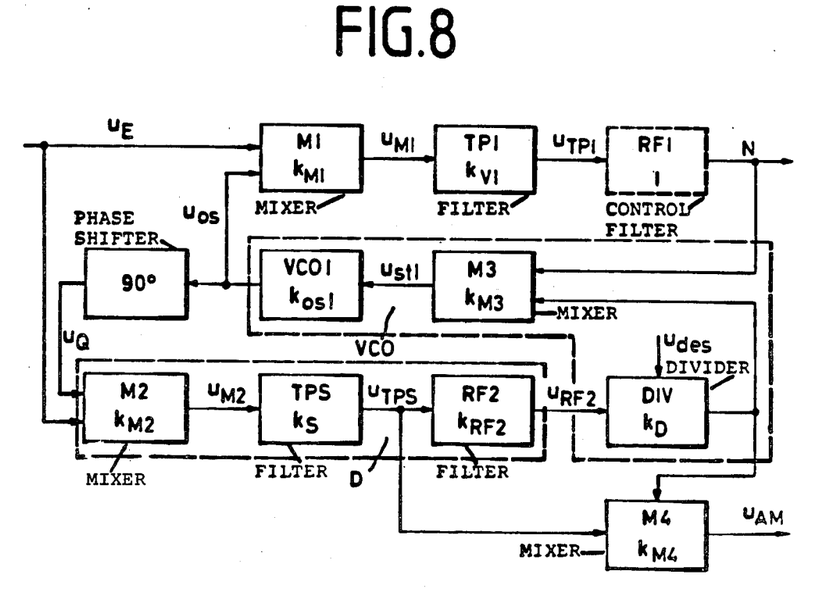
FIG. 8 is a block circuit diagram of another embodiment of a demodulator according to the invention.

FIG. 8 shows a possible embodiment of a circuit with regulation of the modulation sensitivity. The cascade circuit formed by divider DIV and Multiplier M3 can be interpreted as modulation amplifier MA. Together with the voltage controlled oscillator VCO1, they form a voltage controlled oscillator VCO with voltage controlled modulation sensitivity. Comparison of this block diagram with the circuit of FIG. 5 shows, that the only differences are the position of control filter RF1 and the point where the information $u_N(t)$ is coupled out. Now, $u_N(t)$ depends on $\hat{u}_T$. Nevertheless, the demodulated information $u_{AM}(t)$ depends no longer on $\hat{u}_T$.

In the following, some possible operative embodiments of block circuits used in the block diagrams of FIGS. 1 until 8 are given.

As mixers M1 and M2, each active or passive ring mixer can be used the output of which is capable of processing direct currents and voltages. To prevent other output terms than those of the algebraic product of the input signals, it is possible to connect simple RC-low pass filters at the outputs of the mixers. If the input signal voltages become to high, the mixer voltage gain $k_M$ will depend on the input voltages. It is therefore necessary to specify a suitable range of input voltages depending on the special mixer embodiment.

Figure 11:
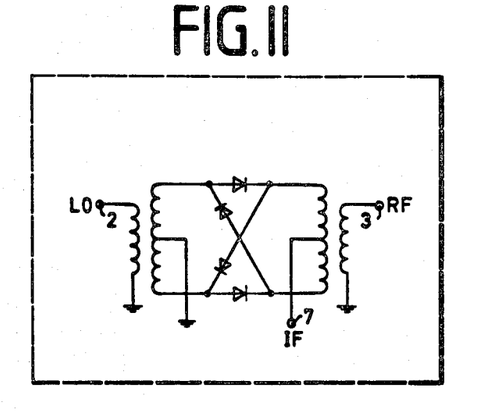
FIGS. 11–17 are circuit diagrams of embodiments of components which can be employed in practical embodiments of demodulators according to the invention.
Figure 13:
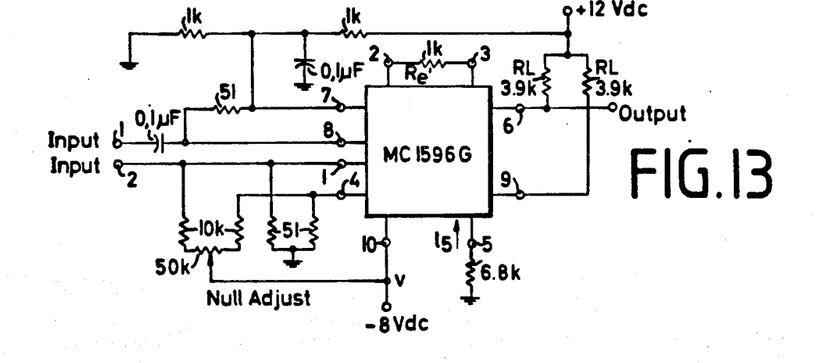

Examples for mixers without controllable gain are shown in FIGS. 11 and 13. FIG. 11 shows a passive ring mixer as it is realized for example in model MD-142 of Anzac Electronics, Waltham, Mass., or in different models of other manufacturers.

Figure 12:
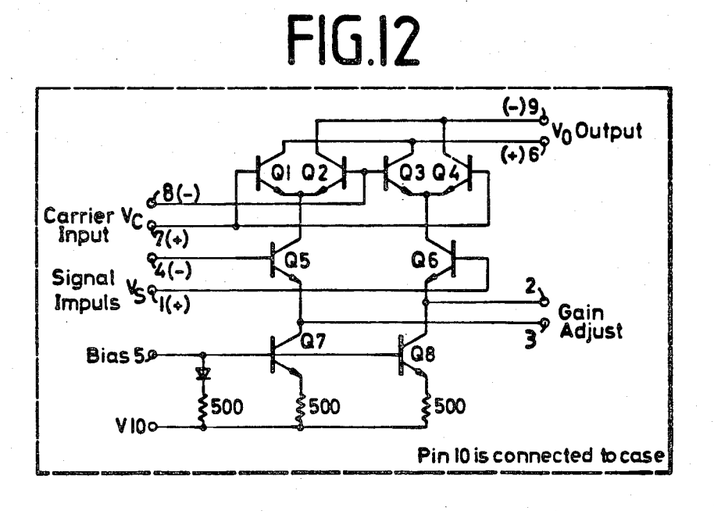
Figure 14:
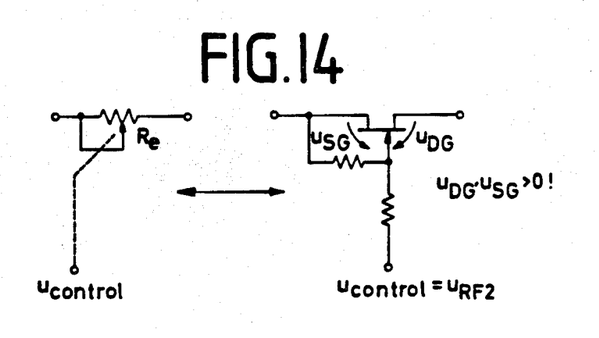

One example for a doubly balanced mixer which can be used with or without controllable gain is the integrated circuit MC 1596 of Motorola Semiconductors Inc., Phoenix, Ariz. (FIG. 12). FIG. 13 shows a typical application of this integrated circuit as mixer without gain control. If the resistor $R_e$ between pins 2 and 3 of this integrated circuit is replaced by a voltage controlled resistor as it is shown in FIG. 14, the mixer gain is voltage controllable.

Figure 15:
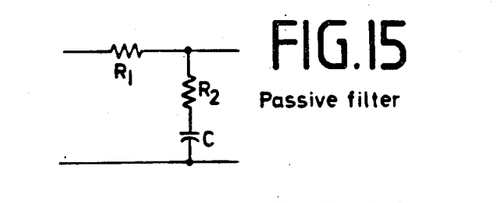
Figure 16:
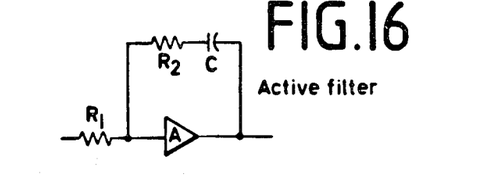

FIGS. 15 and 16 show two typical control filters. Each of them can be used to form the control filters RF1 and RF2. In the filter of FIG. 16 an operational amplifier is used. One possible realization is the integrated circuit Motorola MC 1741 S.

Some embodiments of voltage controlled oscillators are described in: A. Blanchard, Phase Locked Loops, John Wiley & Sons, New York, 1976, in Chapter 2.2.

Some embodiments of multipliers, divider circuits and square root circuits are described in: The Semiconductor Data Library, Volume VI, edited by Motorola Semiconductors Inc., in the description of the integrated circuits MC 1594 L and MC1595 L.

A description of a circuit which forms the rms-value of a voltage is found in: J. Wait, L. Huelsman, G. Korn, Introduction to Operational Amplifier Theory and Applications, in Chapter 3.5 and is called "a true rms voltmeter". The controller filter RF2 in the cascade circuit D can be replaced by this true rms voltmeter following equations (33) and (34).

Figure 17:
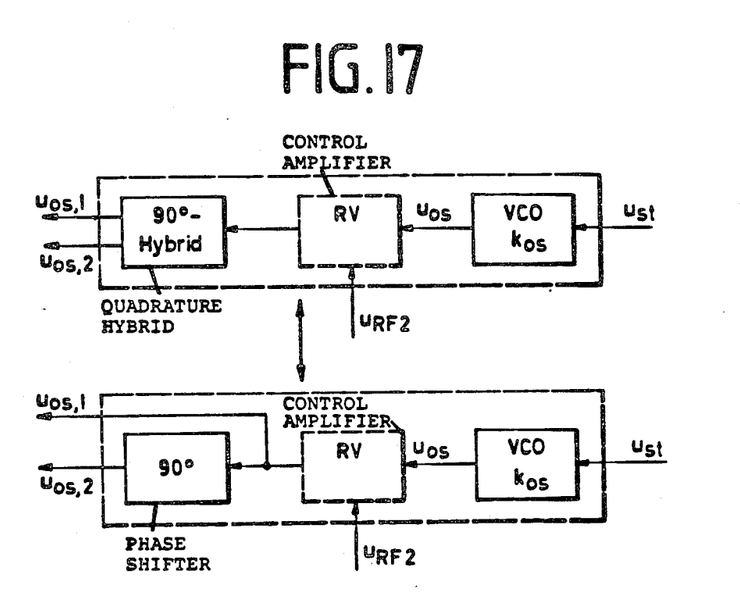

As 90°-phase shifter a quadrature hybrid can be used. A typical realization is the hybrid JH-131 manufactured by Anzac Electronics, Waltham, Mass. The phases of the output signals of this quadrature hybrid differ about 90° at specified input frequencies. FIG. 17 shows a realization as it can be used in the circuits of FIGS. 2,4,5,6, and 8.

It will be understood that the above description of the present invention is susceptible to various modifications, changes and adaptations, and the same are intended to be comprehended within the meaning and range of equivalents of the appended claims.

What is claimed is:

1. In a demodulator circuit for demodulating an input signal constituted by a modulated carrier provided with a phase control loop which comprises signal mixing means having two inputs and an output and providing a signal at its output proportional to the algebraic product of the signals at its inputs, one of the mixing means inputs being arranged to receive the demodulator circuit input signal, voltage controlled oscillator means having a control input and an output connected to the other input of the mixing means and providing a signal at a frequency varying linearly with the voltage at its control input, and lowpass filter means connected between the mixing means output and the oscillator means control input, the components of the loop presenting a set of parameters defining the operation of the loop, which parameters include the peak voltage at the output of the oscillator means, the oscillator means modulation sensitivity, the voltage amplification factor of the lowpass filter means and the gain of the mixing means, the improvement comprising means connected to said loop for varying at least one of said parameters in inverse proportion to the peak amplitude of the input signal carrier for causing the product of the parameters and the carrier peak amplitude to be substantially constant.

2. Circuit as defined in claim 1 wherein said means connected to said loop comprise AM demodulator means including second mixing means, second lowpass filter means and regulating filter means connected together in cascade, said second mixing means having a first input connected to receive the demodulator circuit input signal and a second input connected to receive an oscillation signal locally generated within said circuit and being arranged to provide at its output a signal proportional to the algebraic product of the signals at its inputs, and said regulating filter means providing an output signal proportional to the peak amplitude of the input signal carrier.

3. Circuit as defined in claim 2 further comprising control amplifier means connected in said loop and having a first input connected to receive the output signal from said oscillator means, a second input and an output supplying a regulated output voltage which is a function of the signals at its inputs, and wherein said means connected to said loop further comprise means connected for conducting the output signal from said regulating filter means to said second input of said control amplifier means, and means connected to effect a phase shift of 90° in the regulated output voltage from said control amplifier means output to produce the locally generated oscillation signal.

4. Circuit as defined in claim 2 further comprising third mixing means connected in said loop, and having first and second inputs and an output, and arranged to provide at its output a signal proportional to the algebraic product of the signals at its inputs, said third mixing means being connected, via its first input and its output, between said lowpass filter means and said oscillator means control input, and wherein said means connected to said loop further comprise means connected between the output of said regulating filter means and the second input of said third mixing means for providing a signal inversely proportional to the amplitude of the output signal for said regulating filter means, and means connected to effect a phase shift of 90° in the output signal from said voltage controlled oscillator means to produce the locally generated oscillation signal.

5. Circuit as defined in claim 2 wherein said voltage controlled oscillator means comprises a modulation amplifier the gain of which controls the modulation sensitivity of said oscillator means, and said means connected to said loop comprise means connected for supplying the output signal from said regulating filter means to the control input of said modulation amplifier for controlling the modulation sensitivity of said oscillator means.

6. Circuit as defined in claim 2 wherein said signal mixing means in said loop has a gain control input and is constructed to have a variable gain which is controllable by application of a control signal to its control input, and said means connected to said loop further comprise means connected for conducting the output signal from said regulating filter means to said control input of said signal mixing means, and means connected to effect a phase shift of 90° in the output signal from said voltage controlled oscillator means to produce the locally generated oscillation signal.

* * * * *